US008516298B2

(12) United States Patent
Lu et al.

(10) Patent No.: US 8,516,298 B2
(45) Date of Patent: Aug. 20, 2013

(54) DATA PROTECTION METHOD FOR DAMAGED MEMORY CELLS

(75) Inventors: Ying-Chih Lu, Taipei (TW); Yu-Hui Wang, Taipei (TW)

(73) Assignee: Inventec Corporation, Taipei (TW)

( * ) Notice: Subject to any disclaimer, the term of this patent is extended or adjusted under 35 U.S.C. 154(b) by 222 days.

(21) Appl. No.: 13/157,673

(22) Filed: Jun. 10, 2011

(65) Prior Publication Data

US 2012/0117445 A1  May 10, 2012

(30) Foreign Application Priority Data

Nov. 4, 2010  (TW) .............................. 99137999 A

(51) Int. Cl.
*G06F 11/00* (2006.01)

(52) U.S. Cl.
USPC ............ 714/6.13; 714/2; 714/6.23; 714/6.32; 714/36; 714/42; 714/718; 714/723; 714/763; 714/721; 714/710

(58) Field of Classification Search
None
See application file for complete search history.

(56) References Cited

U.S. PATENT DOCUMENTS

| | | | |
|---|---|---|---|
| 6,766,429 B1 * | 7/2004 | Bland et al. .................... | 711/161 |
| 7,962,807 B2 * | 6/2011 | Nakamura ..................... | 714/710 |
| 8,156,392 B2 * | 4/2012 | Flynn et al. .................... | 714/723 |
| 2005/0060603 A1 * | 3/2005 | Pomaranski et al. ............ | 714/7 |
| 2006/0236165 A1 * | 10/2006 | Cepulis et al. ................ | 714/721 |
| 2011/0154103 A1 * | 6/2011 | Bulusu et al. ................ | 714/6.23 |
| 2011/0154104 A1 * | 6/2011 | Swanson et al. ............. | 714/6.23 |
| 2012/0084611 A1 * | 4/2012 | Flynn et al. .................... | 714/723 |
| 2013/0031322 A1 * | 1/2013 | Bulusu et al. ................. | 711/162 |

* cited by examiner

*Primary Examiner* — John Trimmings
(74) *Attorney, Agent, or Firm* — CKC & Partners Co., Ltd.

(57) ABSTRACT

A data protection method for damaged memory cells is provided. A power-on self-test (POST) is executed, and an initial backup memory is reserved in a memory. An operating system (OS) is executed, and data is loaded from a kernel region of the OS in the memory into a mirror region, so that when a processor accesses the data in the kernel region, it also accesses the data in the mirror region. An uncorrectable error (UE) is detected to determine a damaged page, and a backup page is selected from the initial backup memory or dynamically obtained from the OS to back up data in the damaged page. A mapping address of the damaged page and backup page are recorded into a page mapping table in a memory controller. Accordingly, when the OS accesses the damaged page, the memory controller accesses the backup page instead according to the page mapping table.

7 Claims, 7 Drawing Sheets

DATA PROTECTION METHOD FOR DAMAGED MEMORY CELLS

CROSS-REFERENCE TO RELATED APPLICATION

This application claims the priority benefit of Taiwan application serial no. 99137999, filed Nov. 4, 2010. The entirety of the above-mentioned patent application is hereby incorporated by reference herein and made a part of this specification.

BACKGROUND OF THE INVENTION

1. Field of the Invention

The invention generally relates to a data protection method, and more particularly, to a data protection method for damaged memory cells.

2. Description of Related Art

Along with the development of electronic technology, storage media has become a key factor in information exchange, wherein memory has become the most indispensable storage medium for computers thanks to its high operation speed. However, since the requirement to transmission speed has increased with the increasing data transmission capacity, the demand to large-capacity and high-speed memories has increased too.

However, at the same time of increasing the capacity of a memory, the density of memory cells in the memory is also increased. Accordingly, the size of each memory cell has to be reduced when the density of semiconductor memory devices in an integrated circuit (IC) is increased. Thus, the process for fabricating memory cells of reduced size without sacrificing the original capacitance thereof becomes very complicated, and more errors are likely to be produced in such memory cells when the system access speed is high.

Errors produced in a memory may be correctable errors (CEs) or uncorrectable errors (UEs). A CE is usually a single bit error (SBE) or a multi-bit error (MBE) in which the number and position of the error bits are within a correctable range of an electronic device. A CE can be flexibly corrected through an error detection and correction (EDC) technique. Conventionally, a spare memory module is configured in a memory such that data can be backed up when a CE is detected in the memory. However, the spare memory takes up a lot of memory space therefore causes the memory space to be wasted. Besides, because the operation for backing up data into the spare memory takes a long time, the performance of the entire system is reduced.

On the other hand, conventionally, half of a memory is configured as a mirror memory, and the mirror memory is used for data correction when an UE is detected in the memory. However, because the mirror memory takes up half of the space of the system memory, waste of memory space is caused and the performance of the entire system is reduced. Additionally, in foregoing data mirroring backup technique, every time when data is written or read, both the original memory and the mirror memory have to be accessed in order to keep data in both memories consistent. Thereby, more system resources are consumed.

SUMMARY OF THE INVENTION

Accordingly, the invention is directed to a data protection method for damaged memory cells, wherein a mirror backup is done only regarding the kernel of an operating system (OS) in a memory, so that less memory space is used.

The invention provides a data protection method for damaged memory cells. The data protection method is adaptable to an electronic device having a memory. The memory includes a memory controller and a memory unit. The memory unit is composed of a plurality of memory cells, wherein the memory cells are grouped into a plurality of pages. In the data protection method, a power-on self-test (POST) is first executed, and an initial backup memory is reserved in the memory to be used by an interrupt processing module, wherein the initial backup memory includes a plurality of backup pages. Then, an OS is executed, and data is loaded from a kernel region of the OS in the memory into a mirror region of the memory. When the OS reads the memory, an uncorrectable error (UE) occurred in the memory cells of each page is detected by using the memory controller. When the UE is detected in a page, the page having the UE is determined to be a damaged page, and a backup page is selected from the initial backup memory to back up data in the damaged page. Thereafter, a mapping address of the damaged page and the backup page is recorded into a page mapping table in the memory controller, and when the OS accesses the damaged page, data in the backup page is accessed by the memory controller according to the mapping address in the page mapping table.

According to an embodiment of the invention, in the step of determining a page to be the damaged page when the UE is detected in the page and selecting a backup page from the initial backup memory to back up the data in the damaged page, whether the damaged page is within the kernel region of the OS is determined. If the damaged page is not within the kernel region, an exception software is executed to stop executing an application or a virtual machine affected by the damaged page, and a program code of the application or the virtual machine is re-loaded from a hard disk of the electronic device into the selected backup page to re-execute the application or the virtual machine. If the damaged page is within the kernel region, data corresponding to the damaged page is re-loaded from the mirror region of the memory into the selected backup page, so as to back up data in the damaged kernel region.

According to an embodiment of the invention, in the step of loading the data from the kernel region of the OS in the memory into the mirror region of the memory, a base address and a capacity of the kernel region of the OS are obtained, a mirror base address of the mirror region is then determined, and data is loaded from the kernel region to the mirror base address according to the base address and the capacity of the kernel region, so that when a processor accesses the data in the kernel region, data in the mirror region is also accessed, which is referred to as a memory mirror mechanism.

According to an embodiment of the invention, in the step of executing the POST, a memory segment is further reserved within a system data area of the memory for data exchange between the interrupt processing module of the electronic device and an application module of the OS.

According to an embodiment of the invention, in the step of executing the POST, the interrupt processing module is activated, and a system interrupt function when the UE occurs is enabled.

According to an embodiment of the invention, in the step of executing the OS, a base address and a capacity of the memory segment and the initial backup memory reserved in the memory are obtained from the basic input/output system (BIOS), and the OS is prohibited from using the memory segment and the initial backup memory.

According to an embodiment of the invention, in the step of detecting the UE occurring in the memory cells of each page by using the memory controller, when the memory controller detects the UE, the address of the page having the UE is recorded into a register, and a system interrupt is issued to execute the interrupt processing module.

According to an embodiment of the invention, in the step of selecting the backup page from the initial backup memory to back up the data in the damaged page, whether the number of blank pages in the initial backup memory is smaller than a predetermined value is determined, and if the number of blank pages is smaller than the predetermined value, a memory space is dynamically obtained from the OS as a backup memory.

According to an embodiment of the invention, in the step of dynamically obtaining the backup memory from the OS, a page request is written by the interrupt processing module into the memory segment reserved within the system data area. Then, data in the memory segment within the system data area is checked by the application module to detect the page request written by the interrupt processing module. Next, the backup memory is obtained from the OS and provided to the interrupt processing module by the application module, wherein the interrupt processing module uses the backup memory as a backup page.

According to an embodiment of the invention, in the step of checking the data in the memory segment within the system data area by using the application module to detect the page request written by the interrupt processing module, the data in the memory segment within the system data area is checked by the application module through a polling technique or an interruption technique, so as to detect the page request written by the interrupt processing module.

According to an embodiment of the invention, in the step of obtaining the backup memory from the OS to be used by the interrupt processing module by using the application module, a base address and a capacity of the backup memory are recorded by the application module into the memory segment reserved within the system data area to be used by the interrupt processing module.

According to an embodiment of the invention, in the step of obtaining the backup memory by using the application module to be used by the interrupt processing module, a page usage table is looked up by using the interrupt processing module, so as to select a blank page from the backup memory as a backup page, a state of the backup page is updated to "in use", and a state of the damaged page is updated to "damaged".

According to an embodiment of the invention, in the step of looking up the page usage table by using the interrupt processing module to obtain the blank page from the backup memory as the backup page, if the interrupt processing module detects that there is no more blank page in the backup memory, a system interrupt function when the UE occurs is disabled.

According to an embodiment of the invention, in the step of looking up the page usage table by using the interrupt processing module to obtain the blank page from the backup memory as the backup page, if the interrupt processing module detects that the number of blank pages in the backup memory is smaller than a predetermined value, a memory space is dynamically obtained from the OS as the backup memory.

According to an embodiment of the invention, in the step of looking up the page usage table by using the interrupt processing module to obtain the blank page from the backup memory as the backup page, if the interrupt processing module detects that there is no more blank page in the backup memory, a IPMI OEM command is sent to a baseboard management controller (BMC), and an warning message is issued by the BMC.

According to an embodiment of the invention, the kernel region records a kernel and a system management program of the OS.

According to an embodiment of the invention, the electronic device is powered on through legacy BIOS or extensible firmware interface (EFI) BIOS.

According to an embodiment of the invention, the UE may be a multi-bit error (MBE) in which the number of error bits exceeds a correctable range of the electronic device.

Thereby, in the data protection method for damaged memory cells provided by the invention, a memory address remapping technique of a chipset is adopted, wherein a mirror backup is done only regarding the kernel of the OS in a memory, and when an UE occurs, address of the damaged page is mapped to the address of a normal page. Thus, data in damaged memory cells can be protected without taking up too much memory space.

These and other features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
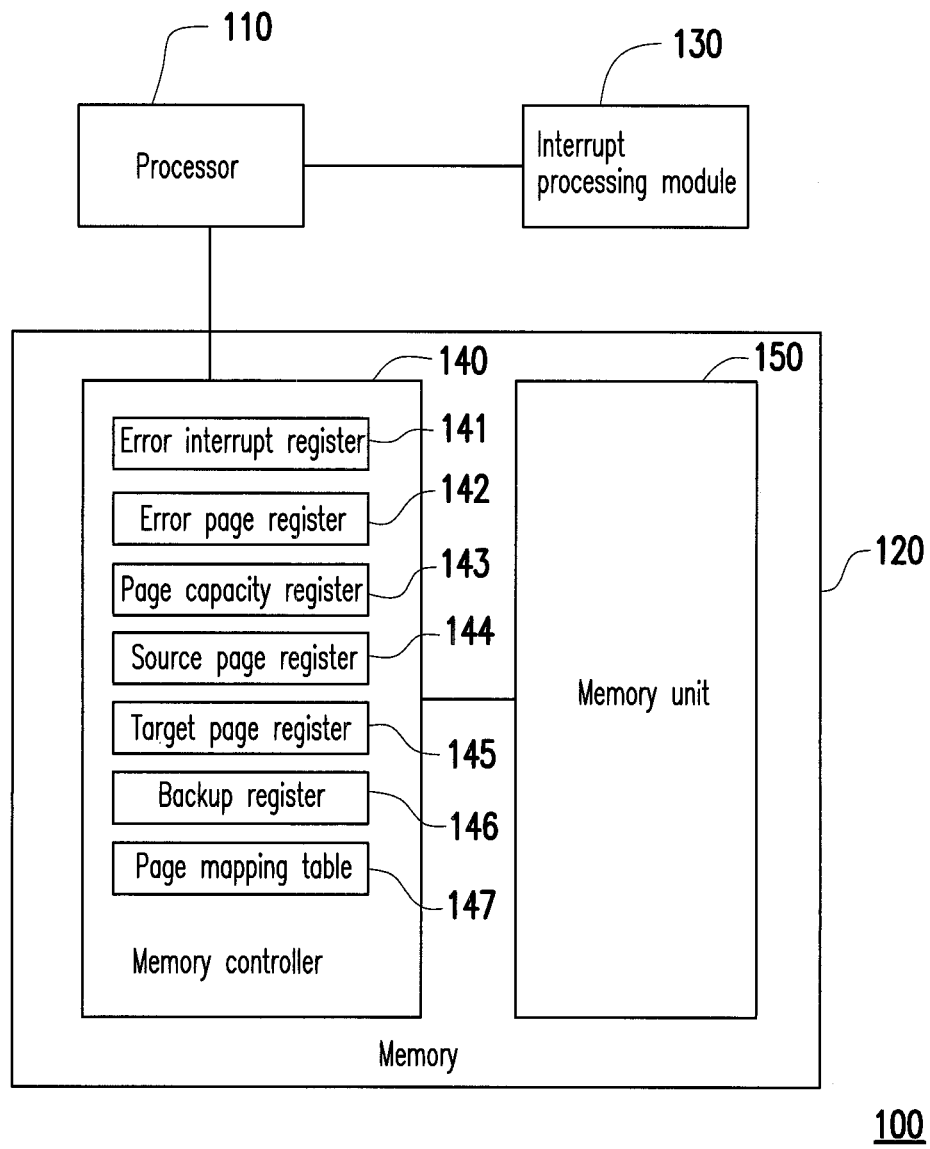
FIG. 1 is a diagram illustrating the system structure of an electronic device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Data within the kernel region of an operating system (OS) in a memory is critical data required by an electronic device for executing the OS. Any uncorrectable error (UE) occurred in this region will directly affect the operation of the entire system or even result in system failure. In order to prevent system failure without taking up too much memory resources, in the invention, the memory is managed in unit of pages, and memory mirroring backup is performed regarding only the kernel data of the OS. When an UE occurs in the memory cells of a page, only the current page is removed from the memory so that more memory space can be left for the OS and the performance of the entire system can be improved. In the invention, a data protection method for damaged memory cells is developed based on foregoing concept, and which will be described in detail with reference to embodiments of the invention.

FIG. 1 is a diagram illustrating the system structure of an electronic device according to an embodiment of the invention. Referring to FIG. 1, in the present embodiment, the electronic device 100 includes a processor 110, a memory 120, and an interrupt processing module 130. The memory 120 includes a memory controller 140 and a memory unit 150 composed of a plurality of memory cells. The processor 110 may be a central processing unit (CPU), and the memory unit 150 may be a dynamic random access memory (DRAM) or another type of memory (not limited herein). The interrupt processing module 130 may be a system management interrupt (SMI) handler for processing system management interrupts (SMIs) received by the processor 110.

To be specific, when a component in the electronic device 100 triggers a SMI, a SMI signal is sent to the processor 110. Once receiving the SMI signal, the processor 110 enters a system management mode (SMM), and a SMI handler is executed by the basic input output system (BIOS) in this mode to process the SMI.

Figure 2:
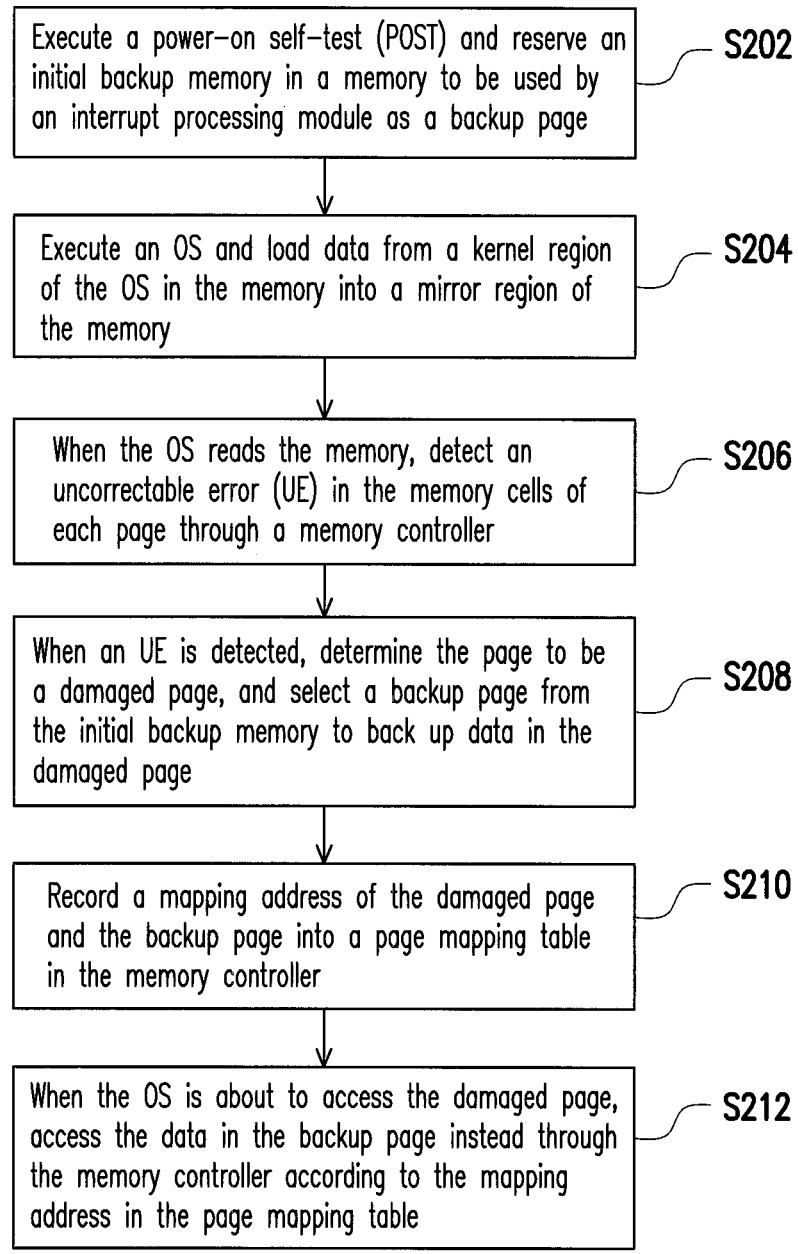
FIG. 2 is a flowchart of a data protection method for damaged memory cells according to an embodiment of the invention.

FIG. 2 is a flowchart of a data protection method for damaged memory cells according to an embodiment of the invention. Referring to FIG. 2, the data protection method in the present embodiment is adaptable to the electronic device 100 in FIG. 1. Below, steps in the data protection method will be described in detail with reference to various components of the electronic device 100 illustrated in FIG. 1.

First, when the electronic device 100 is powered on, the processor 110 executes a power-on self-test (POST) and reserves an initial backup memory (the capacity thereof should be a multiple of the capacity of a page, for example, if the capacity of a page is 8 KB, the capacity of the initial backup memory may be 1 MB) in the memory 120 to be used as a backup page by the interrupt processing module 130 (step S202). Herein the OS cannot use this initial backup memory, and this initial backup memory contains at least one backup page.

To be specific, the processor 110 may execute the POST through legacy basic input/output system (BIOS) or extensible firmware interface (EFI) BIOS and reserve the initial backup memory through INT 15h E820h function of the advanced configuration and power interface (ACPI) (in the legacy BIOS) or through the GetMemoryMap( ) function of the EFI (in the EFI BIOS).

After the POST is completed, the processor 110 executes the OS of the electronic device 100 and loads data from the kernel region of the OS in the memory into a mirror region of the memory (step S204). Herein the processor 110 obtains the base address and capacity of the kernel region of the OS and determines the base address of the mirror region. Besides, the processor 110 loads data from the kernel region to the base address of the minor region by using a newly added ACPI machine language (AML) according to the base address and the capacity of the kernel region, so as to set up and activate a mirror protection function of the kernel region. Thus, when the processor 110 accesses the data in the kernel region, it also accesses the data in the mirror region. This is referred to as a memory mirror mechanism. The AML technique includes 3 input parameters: a parameter 0, a parameter 1, and a parameter 2, wherein the parameter 0 is the base address of the kernel region, the parameter 1 is the capacity of the kernel region, and the parameter 2 is the base address of the mirror region.

In the present embodiment, memory mirroring backup is performed only regarding all program codes and data within the kernel region of the OS in the memory, so that comparing with the conventional technique, less memory space is used in the present embodiment, and the quantity of data to be simultaneously accessed by the system in the original memory and the mirror memory is reduced since the kernel region contains less data.

When the OS reads the memory 120, the memory controller 140 detects any UE occurred in the memory cells of each page (step S206). The UE may be a multi-bit error (MBE) in which the number and position of error bits exceed a correctable range of the electronic device 100. However, the invention is not limited thereto.

To be specific, the processor 110 first enables an error interrupt register 141 to enable a system interrupt function when any UE occurs, and the memory controller 140 detects any UE occurring in the memory cells of each page. Herein the memory controller 140 records the address of the page having the UE in an error page register 142 and issues a system interrupt to execute the interrupt processing module 130. The interrupt processing module 130 determines which page contains the UE by reading the page recorded in the error page register 142.

When the memory controller 140 detects an UE, it triggers a system interrupt. The interrupt processing module 130 determines the page to be a damaged page, obtains a backup page from a backup memory to back up the data in the damaged page (step S208). Herein the backup memory may be the initial backup memory or a memory space dynamically obtained from the OS.

After the data backup is completed, the interrupt processing module 130 records a mapping address of the damaged page and the backup page into a page mapping table 147 in the memory controller 140 (step S210). Herein the interrupt processing module 130 maps the address of the damaged page to the address of the backup page through a memory address remapping technique and respectively fills the addresses of the damaged page and the backup page into the blank fields in the page mapping table 147.

Subsequently, when the OS is about to access the damaged page, the memory controller 140 accesses the data in the backup page instead according to the mapping address in the page mapping table (step S212) so that the data in the damaged memory cells can be protected.

Through aforementioned memory address remapping technique, even though the OS tries to access the original address of a damaged page, it actually accesses the mapping address of the backup page through the remapping operation of the memory controller 140. Thus, in the present embodiment, the program of the OS is not required to be changed.

It should be noted that when the memory controller 140 detects an UE and triggers a system interrupt, the interrupt processing module 130 further determines whether the page containing the UE is within the kernel region of the OS and accordingly loads a program code of the damaged page from the hard disk or the mirror region of the memory to restore the damaged data.

Figure 3:
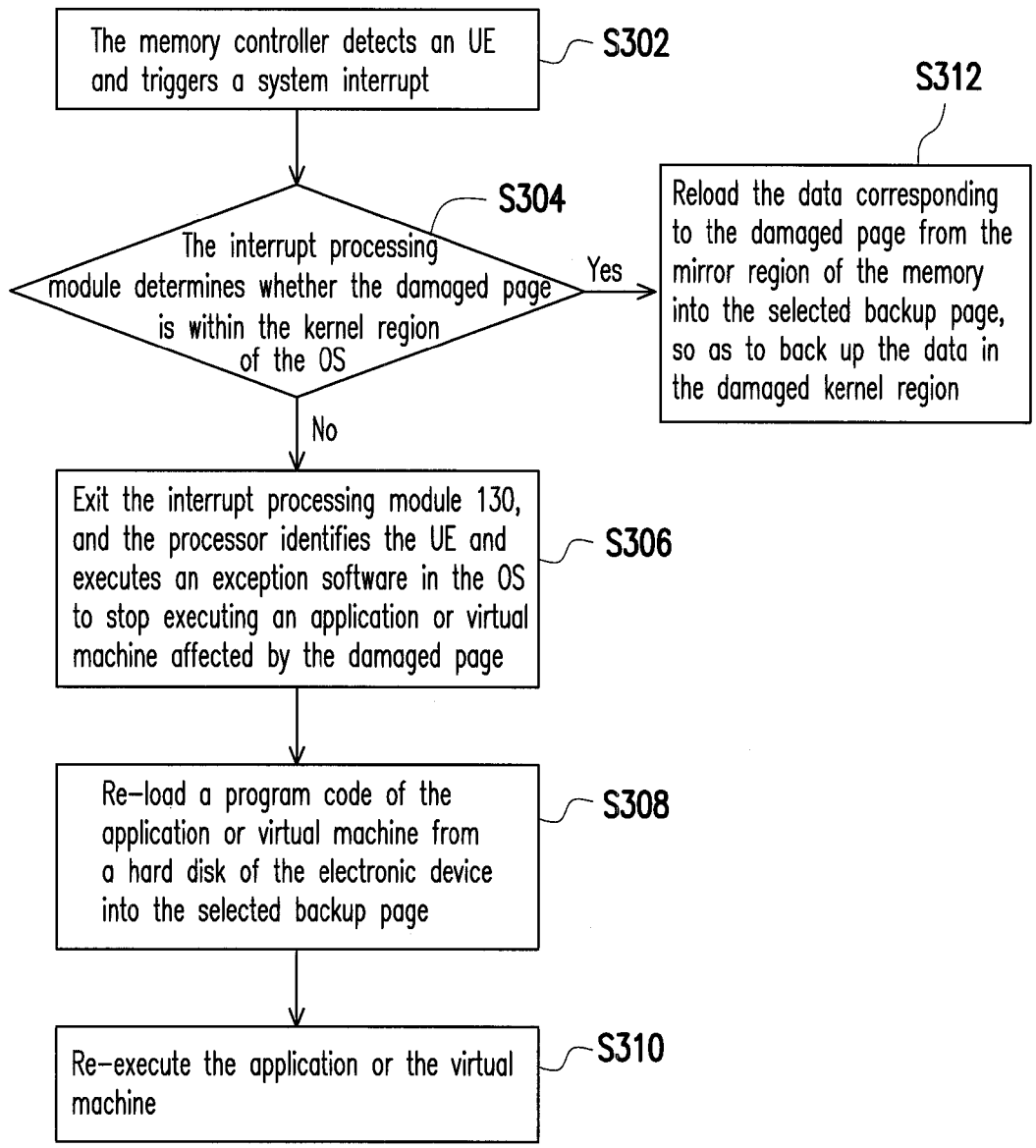
FIG. 3 is a flowchart of a data protection method for damaged memory cells according to an embodiment of the invention.

FIG. 3 is a flowchart of a data protection method for damaged memory cells according to an embodiment of the invention. Referring to both FIG. 1 and FIG. 3, in the present embodiment, when the memory controller 140 detects a UE and triggers a system interrupt (step S302), the interrupt processing module 130 determines whether the damaged page is within the kernel region of the OS (step S304). Herein if the interrupt processing module 130 determines that the damaged page is not within the kernel region, the interrupt processing module 130 is exited, and the processor 110 identifies the UE and executes an exception software in the OS to stop executing an application or virtual machine affected by the damaged page (step S306). Besides, the processor 110 re-loads a program code of the application or virtual machine from the hard disk of the electronic device into the selected backup page (step S308) to re-execute the application or the virtual machine (step S310). Contrarily, if the interrupt processing module 130 determines that the damaged page is within the kernel region, it reloads the data corresponding to the damaged page from the mirror region of the memory into the selected backup page, so as to back up the data in the damaged kernel region (step S312).

In another embodiment, when the processor 110 of the electronic device 100 executes the POST, it further reserves a memory segment within a system data area of the memory 120 for data exchange between the interrupt processing module 130 and an application module of the OS. Below, this operation will be described in detail with reference to an embodiment of the invention.

Figure 4:
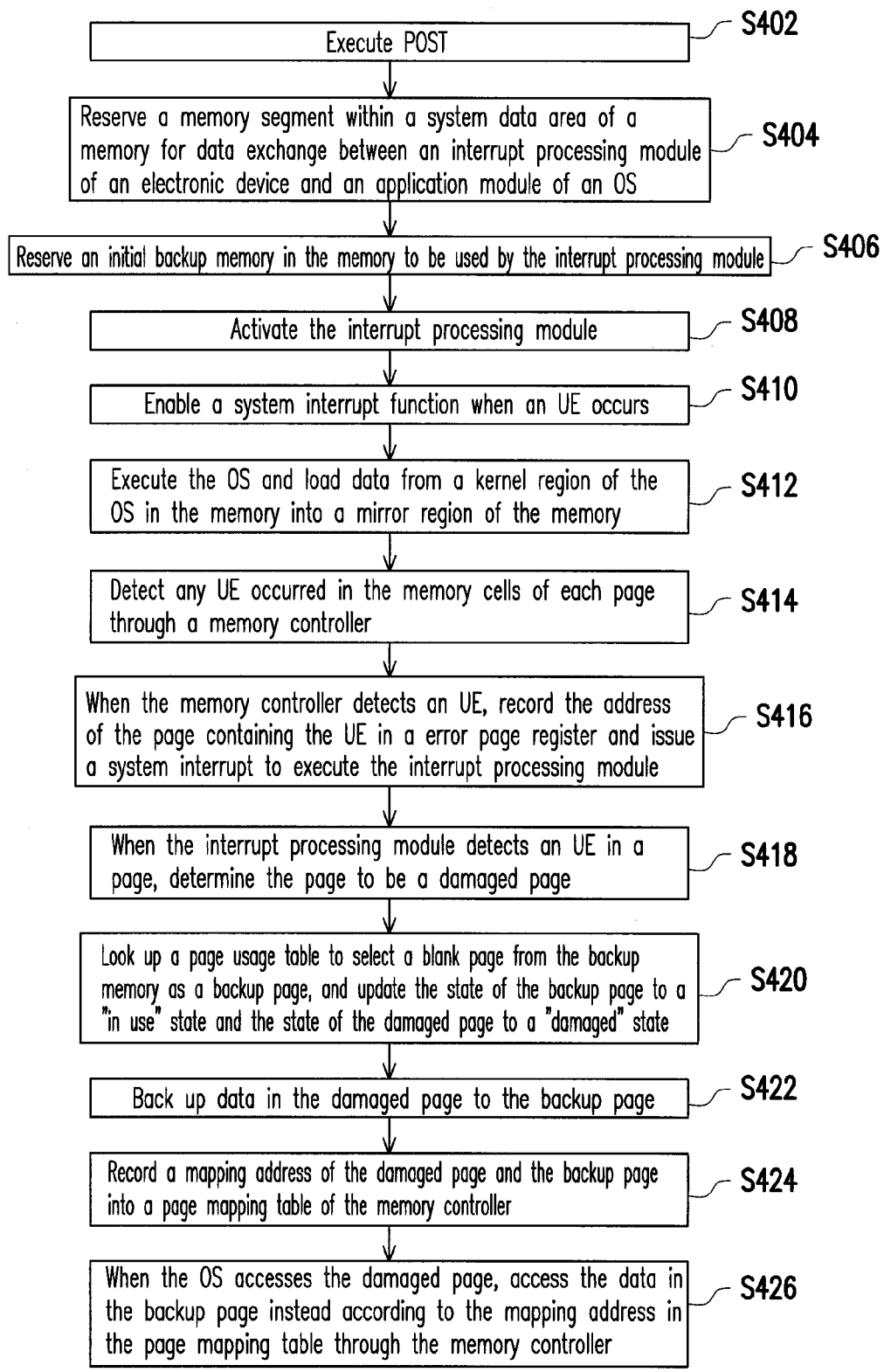
FIG. 4 is a flowchart of a data protection method for damaged memory cells according to an embodiment of the invention.

FIG. 4 is a flowchart of a data protection method for damaged memory cells according to an embodiment of the invention. Referring to FIG. 4, the data protection method in the present embodiment is adaptable to the electronic device 100 in FIG. 1, and below, steps of the data protection method will be described in detail with reference to various components of the electronic device 100 illustrated in FIG. 1.

First, when the electronic device 100 is powered on, the processor 110 executes POST (step S402). Meanwhile, the processor 110 reserves a memory segment within a system data area of the memory 120 for data exchange between the interrupt processing module 130 of the electronic device 100 and an application module of the OS (step S404). Herein the processor 110 may reserve a memory segment that is between addresses 9FC00h-9FFFFh and has a total capacity of 1 KB.

It should be noted that the processor 110 may execute the POST through legacy BIOS, and the memory segment reserved by the processor 110 may be located within an extended BIOS data area (EBDA). In another embodiment, the processor 110 may execute the POST through EFI BIOS and reserve the memory segment by using EFI. The memory segment may be reserved through the NT 15h E820h function of ACPI in legacy BIOS or the function GetMemoryMap( ) of EFI in EFI BIOS. However, these are only examples and the invention is not limited thereto.

Next, the processor 110 reserves an initial backup memory in the memory 120 to be provided to the interrupt processing module 130 as a backup page (step S406). It should be noted that the interrupt processing module 130 can use the initial backup memory as a backup page. When the pages in the initial backup memory are about to be used up, the interrupt processing module 130 dynamically obtains a backup memory of an appropriate capacity (for example, 1 MB) from the OS 180 through the application module 170. When the pages in the backup memory obtained from the OS are also about to be used up, another backup memory is obtained from the OS, and so on. Herein each backup memory includes at least one backup page, and the addresses of these backup memories may be continuous or discontinuous. Namely, the capacity of each backup memory is a multiple of the capacity of a single page. For example, if the capacity of a page is 8 KB, the capacity of a backup memory is a multiple of 8 KB (for example, 1 MB).

Thereafter, the processor 110 activates the interrupt processing module (step S408), wherein the interrupt processing module may be a SMI handler for processing system interrupts. Besides, the processor 110 also enables a system interrupt function when an UE occurs (step S410). Namely, every time when the memory controller 140 detects an UE, it triggers a system interrupt and sends a SMI signal to the processor 110, and the processor then activates the interrupt processing module 130. Herein the processor 110 activates the system interrupt function when an UE occurs by enabling the error interrupt register 141 of the memory controller 140.

It should be noted that when the processor 110 executes the POST, a setup utility of the BIOS or other software tools may be further executed according to a user's operation so that the user can change the capacity of the page used by the memory controller (for example, 8 KB) or the capacity of the initial backup memory (for example, a memory having 128 pages of 8 KB, the capacity thereof is 1 MB) and the capacity of the backup memory every time obtained from the OS (for example, a memory having 128 pages of 8 KB, the capacity thereof is 1 MB).

After the processor 110 finishes executing the POST, it executes the OS and loads data from the kernel region of the OS in the memory into the mirror region of the memory (step S412). Herein the OS can obtain the base address and capacity of the memory segment and the backup memories reserved by the processor 110 in the memory 120 through the interface of the BIOS, such that the OS will not and can not use these memory blocks.

When the OS reads the memory 120, the processor 110 detects any UE occurred in the memory cells of each page through the memory controller 140 (step S414). To be specific, when the memory controller 140 detects an UE, it records the address of the page containing the UE in the error page register 142 and issues a system interrupt to execute the interrupt processing module 130 (step S416). The interrupt processing module 130 determines which page contains the UE by reading the page having the UE recorded in the error page register 142.

When the interrupt processing module 130 detects an UE in a page, it determines this page to be a damaged page (step S418). In detail, the interrupt processing module 130 uses the initial backup memory as a backup page. However, when the backup page is about to be used up, a backup memory needs to be dynamically obtained from the OS. To be specific, the interrupt processing module 130 may exchange data with an application module in the OS by using the memory segment reserved by the processor 110 within the system data area of the memory 120, so as to obtain the backup memory.

If the interrupt processing module 130 detects that the blank pages in the backup memory are about to be used up according to the page usage table, it exchanges data with the application module in the OS by using the memory segment within the system data area of the memory 120, so as to dynamically obtain a memory space from the OS as a backup memory.

Figure 5:
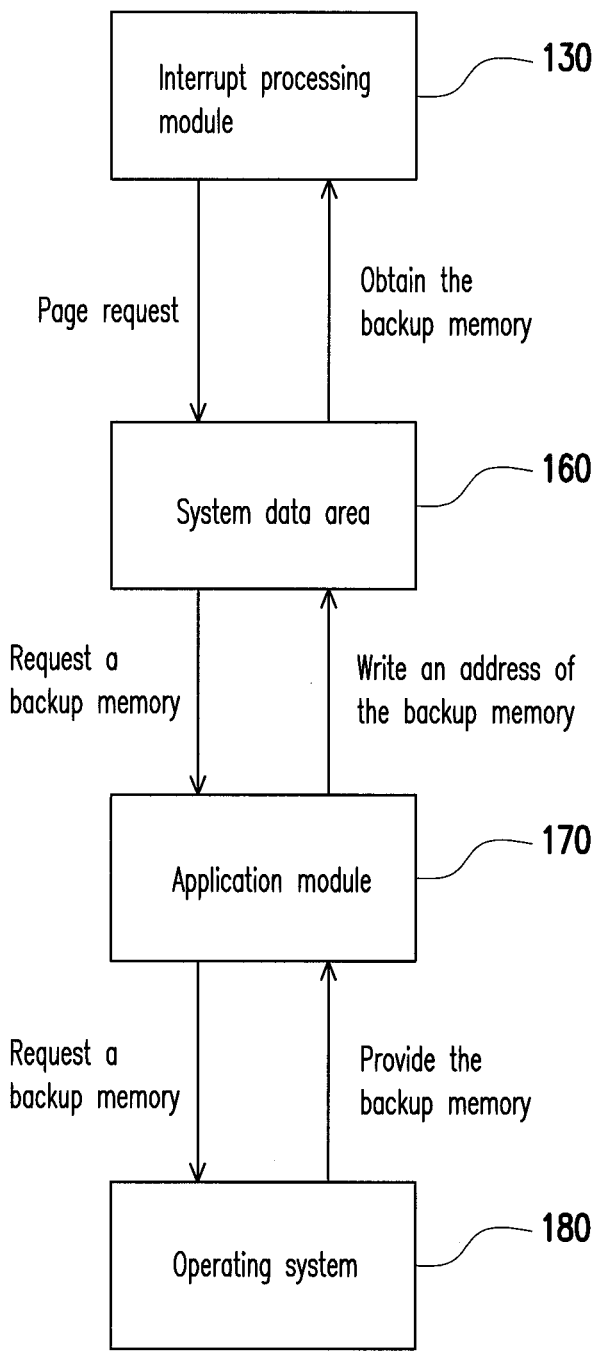
FIG. 5 illustrates an example of dynamically obtaining a backup page from an operating system (OS) according to an embodiment of the invention.
Figure 6:
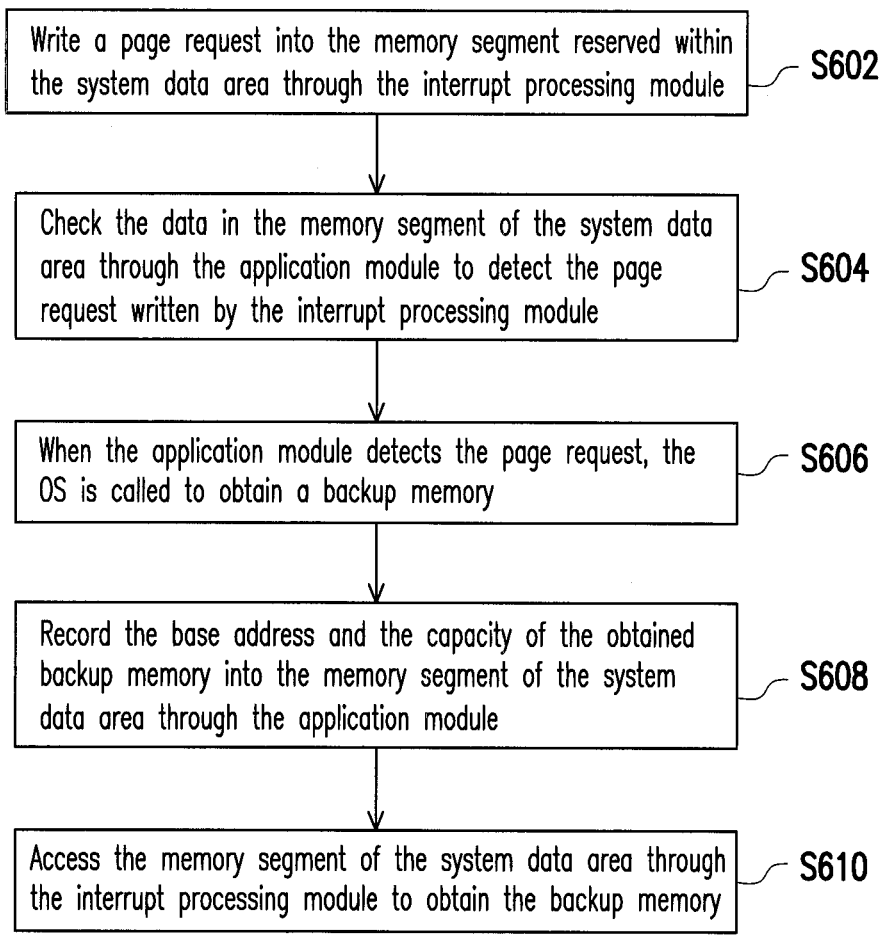
FIG. 6 is a flowchart of a method for dynamically obtaining a backup page from an OS according to an embodiment of the invention.

FIG. 5 illustrates an example of dynamically obtaining a backup page from an OS according to an embodiment of the invention. FIG. 6 is a flowchart of a method for dynamically obtaining a backup page from an OS according to an embodiment of the invention. Referring to both FIG. 5 and FIG. 6, in the present embodiment, data is transmitted between the interrupt processing module 130, the system data area 160, the application module 170, and the OS 180 to obtain a backup memory from the OS 180.

To be specific, in the present embodiment, the interrupt processing module 130 writes a page request into the memory segment reserved within the system data area 160 of the memory 120 by the processor 110 (step S602).

Next, the application module 170 checks the data in the memory segment of the system data area 160 to detect the page request written by the interrupt processing module 130 (step S604). Herein the application module 170 may check the data in the memory segment of the system data area 160 through a polling technique and detect whether the interrupt processing module 130 is requesting a backup memory.

When the application module 170 detects the page request, it calls the OS 180 to obtain a backup memory (step S606) and records the base address and capacity of the obtained backup memory into the memory segment of the system data area 160 (step S608). Finally, the interrupt processing module 130 obtains the backup memory by accessing the memory segment of the system data area 160 (step S610).

Figure 7:
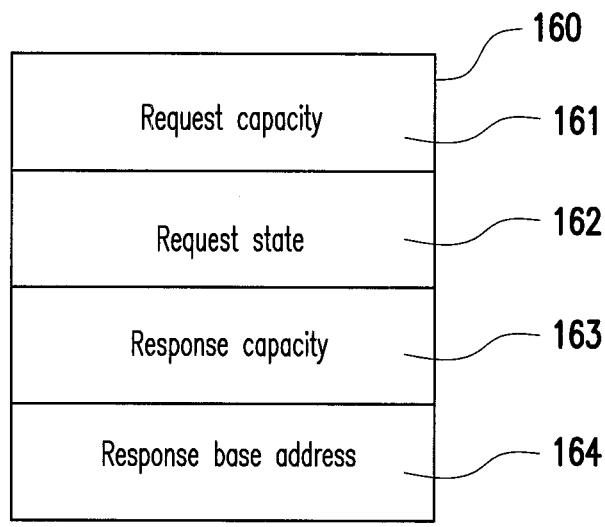
FIG. 7 illustrates an example of a memory segment reserved within a system data area 160 according to an embodiment of the invention.

FIG. 7 illustrates an example of a memory segment reserved within the system data area 160 according to an embodiment of the invention. Referring to FIG. 7, the system data area 160 includes a request capacity field 161, a request state field 162, a response capacity field 163, and a response base address field 164. Herein the interrupt processing module 130 writes the capacity of the requested backup memory in the request capacity field 161 and writes 1 into the request state field 162 to trigger the request of the backup memory. After obtaining the backup memory from the OS 180, the application module 170 records the base address and capacity of the backup memory respectively into the response capacity field 163 and the response base address field 164, and after that, writes 0 into the request state field 162 to indicate that the request is completed. Accordingly, the interrupt processing module 130 can obtain the base address and capacity of the requested backup memory by reading the response capacity field 163 and the response base address field 164.

Referring to FIG. 4 again, in step S418, after obtaining the backup memory, the interrupt processing module 130 further looks up a page usage table to select a blank page from the backup memory as a backup page, and the interrupt processing module 130 updates the state of the backup page to "in use" and the state of the damaged page to "damaged" (step S420). Herein the page usage table may be stored in a random access memory (RAM) in a system management mode (SMM). However, the invention is not limited thereto.

Figure 8:
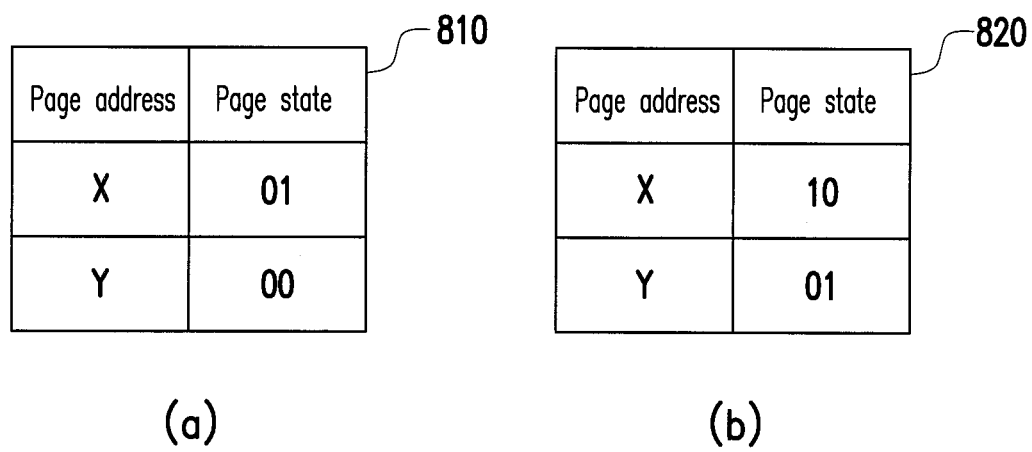
FIG. 8(a) and FIG. 8(b) illustrate an example of how a page usage table is updated according to an embodiment of the invention.

FIG. 8(a) and FIG. 8(b) illustrate an example of how to update page usage tables according to an embodiment of the invention. Referring to FIG. 8(a) and FIG. 8(b), the page usage tables 810 and 820 in the present embodiment respectively include a page address field and a page state field. The page usage table 810 records the original states of the damaged page and the backup page, and the page usage table 820 records the updated states of the damaged page and the backup page. In the present embodiment, 00 indicates that the page is in a "normal" state, 01 indicates that the page is in a "in use" state, 10 indicates that the page is in a "damaged" state, and 11 indicates that the page is in a "reserved" state. It can be understood by referring to FIG. 8(a) and FIG. 8(b) that if the number corresponding to the page x in the page state field changes from 01 into 10, it can be determined that the state of the page x changes from the "in use" state into the "damaged" state, and if the number corresponding to the page y in the page state field changes from 00 into 01, it can be determined that the state of the page y changes from the "normal" state into the "in use" state.

It should be noted that if the interrupt processing module 130 detects that there is no more blank page in the backup memory by looking up the page usage table and no more memory space can be obtained from the OS, it is impossible to back up data in damaged pages by using backup memory. Herein the interrupt processing module 130 may disable a system interrupt function when a correctable error (CE) occurs or send a IPMI OEM command to a baseboard management controller (BMC) such that the BMC can issue a warning message to notify a system administrator to replace the memory unit 150 or take other appropriate actions.

After updating the page usage tables, the interrupt processing module 130 backs up the data in the damaged page into the backup page (step S422). Herein the interrupt processing module 130 writes the capacity of the pages into the page capacity register 143 of the memory controller 140, respectively writes the addresses of the damaged page and the backup page into the source page register 144 and the target page register 145 of the memory controller 140, and enables the backup register 146 (sets to 1), so as to control the memory controller 140 to back up the data in the damaged page into the backup page. Whether the data backup is completed can be determined by detecting whether the state of the backup register 146 is restored (set to 0).

After finishing the data backup, the interrupt processing module 130 records a mapping address of the damaged page and the backup page into the page mapping table 147 of the memory controller 140 (step S424). Herein the interrupt processing module 130 may map the address of the damaged page to the address of the backup page through a memory address remapping technique and respectively fill the addresses of the damaged page and the backup page into the blank fields of the page mapping table 147.

When subsequently the OS is about to access the damaged page, the memory controller 140 accesses the data in the backup page instead according to the mapping address in the page mapping table (step S426), so that data in the damaged memory cells can be protected.

In summary, in the data protection method for damaged memory cells provided by the invention, a memory is divided into a plurality of pages, and when an UE occurs in the memory cells of a page, only this page is removed from the memory. By adopting such a progressive page removing technique, UE is prevented from occurring. Moreover, because a backup memory is requested from the OS only when the pages in the existing backup memory are about to be used up (i.e., memory blocks are progressively requested from the OS), more memory space can be used by the OS. Thereby, the performance of the entire system is improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data protection method for damaged memory cells, adaptable to an electronic device having a memory, wherein the memory comprises a memory controller and a memory unit, the memory unit comprises a plurality of memory cells, and the memory cells are grouped into a plurality of pages, the data protection method comprising:

executing a power-on self-test (POST);

reserving a memory segment within a system data area of the memory for data exchange between the interrupt processing module of the electronic device and an application module of the OS;

reserving an initial backup memory in the memory to be used by the interrupt processing module of the electronic device, wherein the initial backup memory comprises a plurality of backup pages;

activating the interrupt processing module;

enabling a system interrupt function when an uncorrectable error (UE) occurs;

executing the operating system (OS), and loading data from a kernel region of the OS in the memory into a mirror region of the memory;

obtaining a base address and a capacity of the memory segment and the initial backup memory reserved in the memory from a basic input/output system (BIOS), and prohibiting the OS from using the memory segment and the initial backup memory of the memory;

detecting the UE occurred in the memory cells of each of the pages through the memory controller when the OS reads the memory;

determining the page having the UE to be a damaged page, and selecting one of the backup pages in the initial backup memory to back up data in the damaged page to the backup page when the UE is detected in one of the pages;

recording a mapping address of the damaged page and the backup page into a page mapping table in the memory controller; and accessing data in the backup page instead through the memory controller according to the mapping address in the page mapping table when the OS accesses the damaged page.

2. The data protection method according to claim 1, wherein the step of loading the data from the kernel region of the OS in the memory into the mirror region of the memory comprises:

obtaining a base address and a capacity of the kernel region of the OS;

determining a mirror base address of the mirror region; and loading the data from the kernel region to the mirror base address according to the base address and the capacity of the kernel region.

3. The data protection method according to claim 1, wherein the step of detecting the UE occurring in the memory cells of each of the pages through the memory controller comprises:

recording an address of the page having the UE into a register, and issuing a system interrupt to execute the interrupt processing module when the UE is detected through the memory controller.

4. The data protection method according to claim 1, wherein the step of determining one of the pages to be the damaged page when the UE is detected in the page and selecting one of the backup pages in the initial backup memory to back up data in the damaged page to the backup page comprises:

determining whether the damaged page is within the kernel region of the OS;

when the damaged page is not within the kernel region, executing an exception software to stop executing an application or a virtual machine affected by the damaged page, and re-loading a program code of the application or the virtual machine from a hard disk of the electronic device into the selected backup page to re-execute the application or the virtual machine; and when the damaged page is within the kernel region, re-loading data corresponding to the damaged page from the mirror region of the memory into the selected backup page to back up data in the damaged kernel region.

5. The data protection method according to claim 1, wherein the kernel region comprises recording a kernel and a system management program of the OS.

6. The data protection method according to claim 1, wherein the electronic device is powered on through a legacy BIOS or an extensible firmware interface (EFI) BIOS.

7. The data protection method according to claim 1, wherein the UE comprises a multi-bit error (MBE) in which a number of error bits exceeds a correctable range of the electronic device.

\* \* \* \* \*